United States Patent [19]

Ishida

[11] 4,074,236
[45] Feb. 14, 1978

[54] MEMORY DEVICE
[75] Inventor: Akira Ishida, Tokyo, Japan
[73] Assignee: Nippon Telegraph and Telephone Public Corporation, Tokyo, Japan
[21] Appl. No.: 640,227
[22] Filed: Dec. 12, 1975
[30] Foreign Application Priority Data
Dec. 16, 1974 Japan .................................. 49-144243
[51] Int. Cl.² ............................................. G11C 13/00
[52] U.S. Cl. .................................... 365/200; 364/900
[58] Field of Search ........................ 340/173 BB, 172.5
[56] References Cited
U.S. PATENT DOCUMENTS

| | | | |
|---|---|---|---|
| 3,573,751 | 4/1971 | DeLisle | 340/173 BB |
| 3,810,301 | 5/1974 | Cook | 340/173 BB |
| 3,845,476 | 10/1974 | Boehm | 340/173 BB |
| 3,882,470 | 5/1975 | Hunter | 340/173 BB |
| 3,897,626 | 8/1975 | Beausoleil | 340/173 BB |

Primary Examiner—Terrell W. Fears

[57] ABSTRACT

A memory device is disclosed which has a memory portion comprising a plurality of major memory blocks, each composed of a plurality of minor memory blocks which, in turn, are respectively composed of a plurality of memory cells. Information as to whether each of the minor memory blocks making up each of the major memory blocks includes defective memory cells or not is registered and when an address corresponding to any one of the major memory blocks is selected, a predetermined number of minor memory blocks including no defective memory cells are selected with reference to the registered information and data is input to the selected minor memory blocks and output therefrom. Thus, even if the memory device has defective memory cells and has executed the exclusive operation of them, it is possible to effect an access without any time lag by the addition of a small amount of hardware.

6 Claims, 6 Drawing Figures

MEMORY DEVICE

BACKGROUND OF THE INVENTION

1. Field of the Invention

This invention relates to information memory device for information processing systems or the like, and more particularly to a memory device which enables the use of partially defective memory elements that normally would be rejected as unusable during the production process.

2. Description of the Prior Art

Generally, the memory device of this kind is always composed of an assembly of perfect memory cells so that its normal operation appears to the user to be performed even if any of the memory cells is selected. In recent years, the memory device of this type is formed with semiconductor memory elements, each having a large number of memory cells integrated on a silicon chip. However, the yield of good semiconductor memory elements such that all the memory cells on the silicon chip are perfect is low. Further, even if only one memory cell becomes defective in the operation of the memory device, the whole memory element having the defective cell is rendered unusable. Therefore, the memory device of this type in the prior art is very uneconomical.

In the prior art, one method that has been employed for a memory device having a very small number of defective memory cells is, for example, to previously write information with the use of an error correcting code in the memory and to automatically correct the information read out therefrom. However, this method is limited only to the case where a very small number of bits of a word are stored in the defective cells. And even if this method is applied to a memory device employing a large number of partially defective memory elements, no error correction can be achieved correctly, so that the above method is ineffective. Further, in order to use the memory elements having defective memory cells, it is also possible to wire the memory elements so that the wiring by-passes the defective memory cells. However, this method requires re-processing of the memory elements, and hence has the disadvantage of inevitably increasing the manufacturing cost of the semiconductor memory element having a large number of memory cells integrated.

SUMMARY OF THE INVENTION

One object of this invention is to provide a memory device which employs partially defective semiconductor memory elements but appears to the user to be comprised of all perfect memory cells.

Another object of this invention is to provide a memory device which can be effectively used even if some of memory cells of a semiconductor memory elements are imperfect, thereby to reduce the cost of the memory element and hence economize the memory device itself.

Still another object of this invention is to provide a memory device which does not require any close examination of individual memory cells in the production of semiconductor memory elements, thereby to cut down the expense for the examination of the memory elements.

Briefly stated, this invention is embodied in a memory device in which all memory cells making up the memory device are sorted into minor memory blocks respectively having a selection function and are further sorted into major memory blocks, each composed of an assembly of the minor memory blocks. A low order address code is applied from the user to the minor memory block to select only one of its memory cells to effect an input/output operation of a 1-bit data. On the other hand, a high order address code is applied from the user to the major memory blocks to select a desired one of them and, at the same time, all the minor memory blocks making up the selected major memory block are selected, providing a bit width necessary for the word organization. Namely, according to this invention, the major memory blocks are each composed of the required number of minor memory blocks for the word organization and several reserve minor memory blocks. Immediately prior to the start of the operation of the memory device according to this invention, the presence or absence of defective minor memory blocks in all of the major memory blocks is checked and the result of the checking is registered. Then, during operation, when a desired one of major memory blocks is selected, a logical operation of a data input/output portion is achieved so that the required number of good minor memory blocks for the word organization are selected from the selected major memory block. As a result of this, even when several imperfect minor memory blocks are present in the major memory block, if the number of the imperfect minor memory blocks is not larger than that of perfect reserve minor memory blocks, the required number of bits for the word organization is always secured in the selected major memory block and the normal operation of the memory device is achieved. Each semiconductor memory element for use in the memory device of this invention may be formed with one or more minor memory blocks, or one or more major memory blocks. And even if the semiconductor memory element has some imperfect memory cells, it does not matter.

DESCRIPTION OF THE PREFERRED EMBODIMENTS

Figure 1:
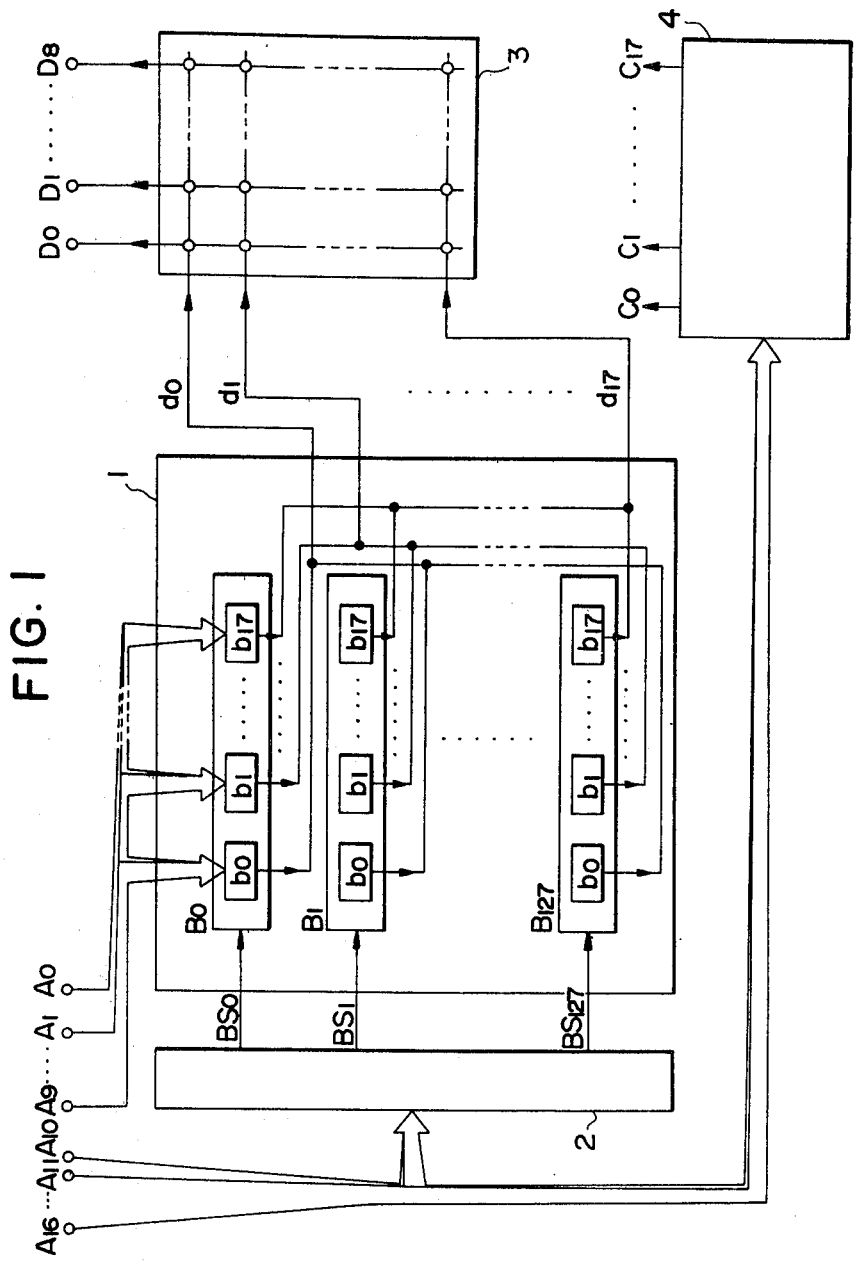
FIG. 1 is a block diagram showing one embodiment of a memory device of this invention.

FIG. 1 shows in block form one embodiment of this invention. In FIG. 1, reference numeral 1 indicates a memory portion; 2 designates a block select portion; 3 indentifies an input/output control portion; and 4 denotes a control information registration portion. The memory portion 1 is comprised of, for example, 128 major memory blocks $B_0$, $B_1$, ... and $B_{127}$. For example, in the case where the unit bit width necessary for the word organization is 9 bits (1 byte), each major memory block is composed of 9 minor memory blocks $b_0$, $b_1$, ... and $b_8$ and, for example, 9 reserve minor memory blocks $b_9$, $b_{10}$, ... and $b_{17}$. Further, each minor memory block is composed of, for example, 1024 memory cells. The memory block or blocks will hereinafter be referred to as the block or blocks for the sake of simplicity. Each minor block has an address code circuit and the 1024 memory cells are respectively correlated to address codes $A_0, A_1, \ldots$ and $A_9$.

Data input/output lines of the 18 minor blocks forming each major block are respectively wired-OR'ed with data input/output lines of the minor blocks of the other major blocks corresponding thereto and are arranged as 18 lines $d_0, d_1, \ldots$ and $d_{17}$.

The block select portion 2 is supplied with address codes $A_{10}, A_{11}, \ldots$ and $A_{16}$ and composed of a decoder circuit which produces block select signal $BS_0, BS_1, \ldots$ and $BS_{127}$, respectively corresponding to the 128 major blocks. This decoder circuit may be a decoder circuit comprising known various logical circuits. In the major block designated by one of the block select signals $BS_0, BS_1, \ldots$ and $BS_{127}$, the memory cells designated by the address codes $A_0, A_1, \ldots$ and $A_9$ are respectively selected in parallel in connection with the 18 minor blocks.

The input/output control portion 3 comprises a 9 × 18 switch matrix composed of, for example, semiconductor switching circuits, crossbar switches, etc., and control circuits for the respective switches. This input/output control portion 3 controls the connections of the 18 input/output lines $d_0, d_1, \ldots$ and $d_{17}$ from the memory portion 1 and 9 data buses $D_0, D_1, \ldots$ and $D_8$.

The control information registration portion 4 is to store information $C_0, C_1, \ldots$ and $C_{17}$ for controlling the abovesaid switch matrix. For example, in the present embodiment, the control information registration portion 4 is formed with a memory module comprising perfect memory elements having a word number of 128 bits and a word width of 18 bits. Each word is correlated to one of the 128 major blocks, and each bit is correlated to one of the 18 minor blocks making up the major block.

Figure 2:
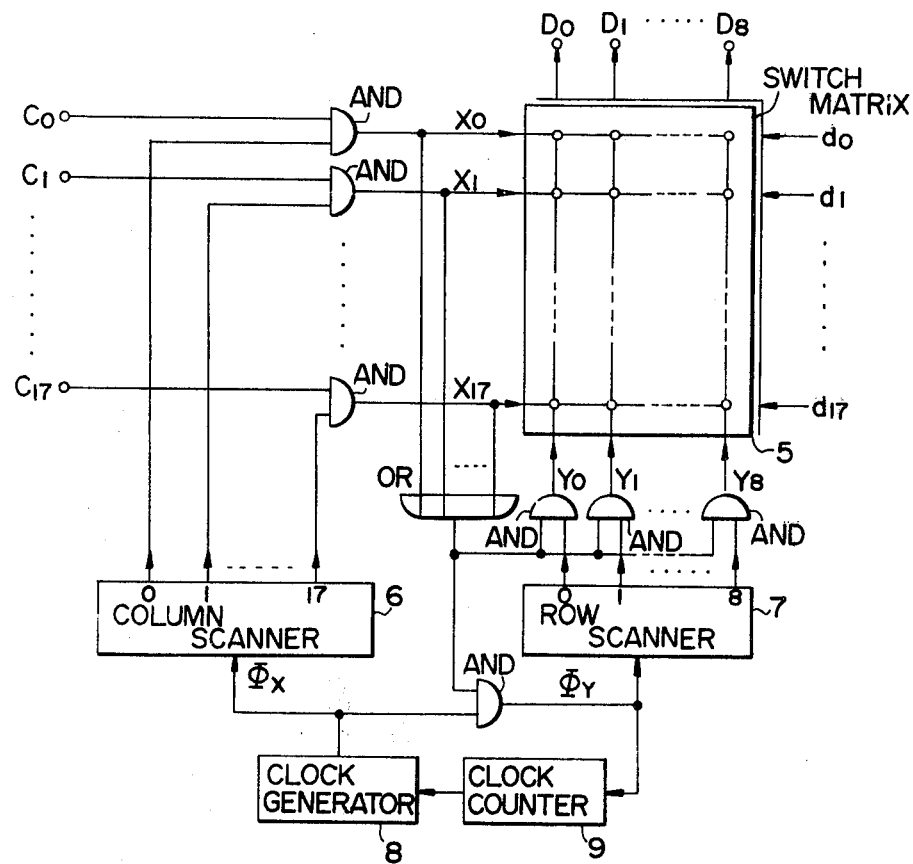
FIGS. 2 and 3 are block diagrams illustrating other embodiments of this invention respectively having an input/output control portion different from that of the memory device of FIG. 1.

Next, a description will be given of concrete means for selectively connecting the input/output lines $d_0, d_1, \ldots$ and $d_{17}$ of the abovesaid memory portion 1 with the data buses $D_0, D_1, \ldots$ and $D_8$ by the use of the abovesaid control information $C_0, C_1, \ldots$ and $C_{17}$. FIG. 2 illustrates one embodiment of the input/output control portion 3 for use in this invention. In FIG. 2, column control signals $X_0, X_1, \ldots$ and $X_{17}$ of a switch matrix 5 are the outputs from AND gates respectively supplied with the outputs from a column scanner 6 and the control information $C_0, C_1, \ldots$ and $C_{17}$ read out from the control information registration portion 4. Further, row control signals $Y_0, Y_1, \ldots$ and $Y_8$ are obtained by supplying AND gates with the output from an OR gate supplied with the column control signals $X_0, X_1, \ldots$ and $X_{17}$ and the outputs from a row scanner 7. In the case where one of the column control signals $X_i (i = 0, 1, 2, \ldots)$ and one of the row control signals $Y_j (j = 0, 1, 2, \ldots)$ are both "1," a switch at the point of intersection of the both signal lines operates, by which the input/output line $d_i$ corresponding to the column control signal $X_i$ is connected with the data bus $D_j$ corresponding to the row control signal $Y_j$.

The column scanner 6 is formed with, for example, a known shift register circuit or the like and has such a construction that it is supplied with a column clock signal $\Phi x$ from a clock generator 8 to produce "1" from first to eighteenth output lines in a sequential order.

On the other hand, the row scanner 7 is similarly formed with, for example, a known shift register circuit or the like and has such a construction that it is driven by a row clock signal $\Phi y$ which is formed by an AND logical obtained with an OR logic signal among the column control signals $X_0, X_1, \ldots$ and $X_{17}$ and the column clock signal $\Phi x$, sequentially producing "1" in 9 output lines in synchronization with the row clock signal $\Phi y$. In other words, the column and row scanners 6 and 7 have the same function as an address counter which is read in a serial manner. The clock generator 8 is adapted so that it starts clock generation at the instants of the production of the control information $C_0, C_1, \ldots$ and $C_{17}$ from the control information registration portion 4 and then stops the clock generation at the instant of a clock counter 9 having counted nine row clock signals $\Phi y$.

In the case of combining the construction of FIG. 1 with the input/output control portion 3 described above in connection with FIG. 2, the device of this invention operates in the following manner. At first, the respective major blocks are checked for defective minor blocks immediately before starting of the operation of the memory device. That is, when the major blocks to be checked are selected by the block select portion 2 in a sequential order, the words respectively corresponding to the major blocks are designated in the control information registration portion 4 one after another. And, at the same time, the 18 minor blocks making up each major block are checked for defective memory cells and the results of this checking are sequentially registered and stored in the abovesaid designated word in the form of, for example, "1" and "0" respectively corresponding to good and defective minor blocks.

Upon completion of the above operation, the device of this invention is put in its operable state and performs the following operations. That is, when the address codes $A_0, A_1, \ldots$ and $A_{16}$ for the data to be input or output are designated from the user, the major block $B_i$ corresponding to the high order codes $A_{10}, A_{11}, \ldots$ and $A_{16}$ is selected and the memory cells corresponding to the low order codes $A_0, A_1, \ldots$ and $A_9$ are selected in connection with all of the minor blocks $b_0, b_1, \ldots$ and $b_{17}$ of the major block $B_i$. And, at the same time, in the control information registration portion 4, the words corresponding to the high order codes $A_{10}, A_{11}, \ldots$ and $A_{16}$ are designated and the information in the words (the abovesaid results of checking) is provided in the form of the control information $C_0, C_1, \ldots$ and $C_{17}$. On the other hand, upon application of the control information $C_0, C_1, \ldots$ and $C_{17}$ to the input/output control portion 3, a first column clock signal $\Phi x$ is derived from the clock generator 8, by which only the first output of the column scanner 6 is rendered "1." In the case where the control information $C_0$ is "1" (indicating that the minor block $b_0$ is good), the column control signal $X_0$ is "1" and the row clock signal $\Phi y$ is produced, by which the first output of the row scanner 7, that is, the row control signal $Y_0$, is rendered "1." As a result of this, the switch corresponding to the point of intersection of those signal lines of the switch matrix 5 to which the column and row control signals $X_0$ and $Y_0$ are respectively applied, is actuated, by which the input/output line $d_0$ of the memory portion 1 corresponding to the column control signal $X_0$ and the data bus $D_0$ corresponding to the row control signal $Y_0$ are connected to each other. Where the control information $C_0$ is "0" (indicating that the minor block is defective), the column control signal $X_0$ becomes "0," so that the column clock signal $\Phi y$ and the column control signal $Y_0$ both become "0" and the input/output line $d_0$ is not connected to any of the data buses $D_0, D_1, \ldots$ and $D_8$. Thereafter, second, third, ... column clock signals $\Phi x$ are sequentially derived from the clock generator 8 and, by the operations similar to those described above, only the input/output line $d_i$ that the control information $C_i$ is "1" (indicating that the minor block $b_i$ is good) is connected to any of the data buses $D_0, D_1, \ldots$ and $D_8$ one after another. And at the instant when a ninth row clock signal $\Phi y$ has been counted by the clock counter 9 (at the instant of the completion of the connections of the input/output lines corresponding to the 9 good minor blocks), the column clock generation by the clock generator 8 is stopped, thus completing the operation of the input/output control portion 3. At the instant when the operation of the input/output control portion 3 has thus been completed, data input/output in and from the device of this invention is effected by the user and, thereafter, new address codes $A_0, A_1, \ldots$ and $A_{16}$ are applied and the same operations are performed.

Figure 3:
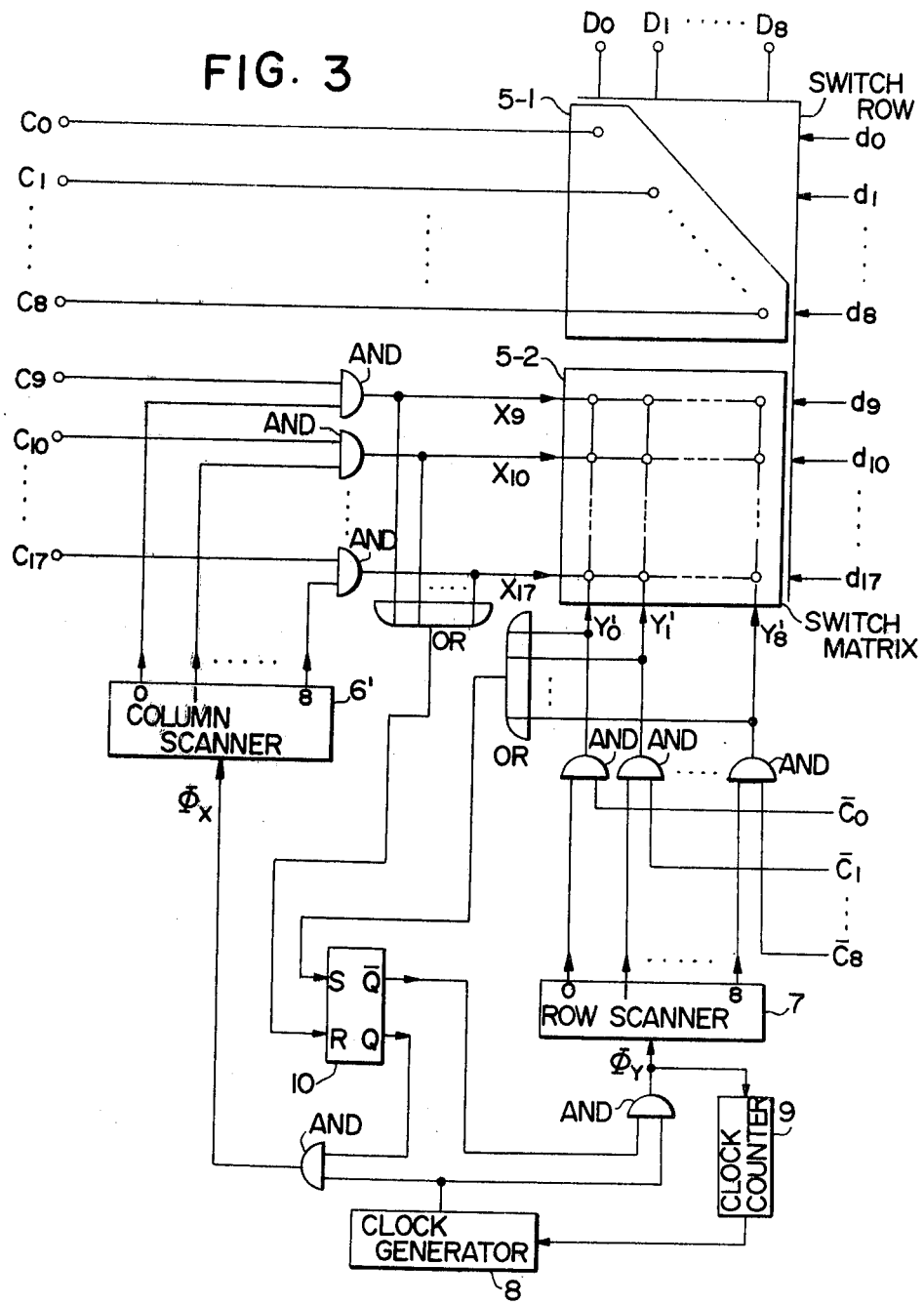

FIG. 3 shows another embodiment of the input/output control portion 3 for use in the device of this invention. In FIG. 3, the switch matrix 5 is composed of a $9 \times 1$ one-dimensional switch array 5-1 and a $9 \times 9$ switch matrix 5-2. The switch array 5-1 is directly supplied with one part $C_0, C_1, \ldots$ and $C_8$ of the control information and the switch matrix 5-2 is supplied with the column control signals $X_9, X_{10}, \ldots$ and $X_{17}$ and row control signals $Y_0', Y_1', \ldots$ and $Y_8'$. The column and row control signals are derived from a control circuit to which are applied as inputs reversed information $\overline{C_0}, \overline{C_1}, \ldots$ and $\overline{C_8}$ of one part of the control information and one part $C_9, C_{10}, \ldots$ and $C_{17}$ of the control information and which is formed with the combination of a column scanner 6', the row scanner 7, the clock generator 8, the clock counter 9, a bistable circuit 10, AND circuits and OR circuits in a manner similar to that in the FIG. 2 embodiment. This control circuit performs the same function as that in FIG. 2. That is, the column control signal $X_k$ corresponding to $C_k$ of one part $C_9, C_{10}, \ldots$ and $C_{17}$ of the control information which is "1" and the row control signal corresponding to $Y_l'$ of one part $C_0, C_1, \ldots$ and $C_8$ of the control information which is "0," are rendered "1" by the actions of the clock generator 8, the column scanner 6', the bistable circuit 10 and the row scanner 7. A switch at the point of intersection of the both signals $X_k$ and $Y_l'$ on the switch matrix is actuated to connect the input/output line $d_k$ of the memory portion 1 with the data bus $D_l$. Accordingly, even if the input/output control portion 3 of this embodiment is applied to the construction of FIG. 1, the device of this invention performs the same operations described above with regard to FIG. 2.

Figure 4:
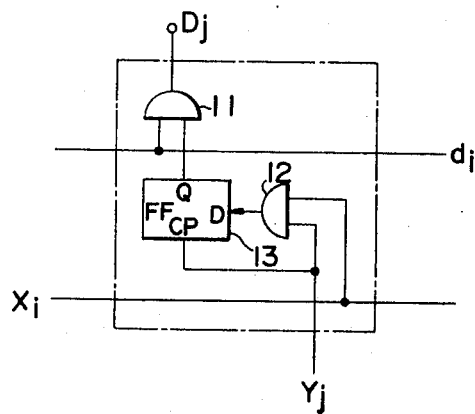
FIGS. 4 and 5 are block diagram showing other embodiments of this invention respectively having a switch of a switch matrix different from those depicted in FIGS. 2 and 3.
Figure 5:
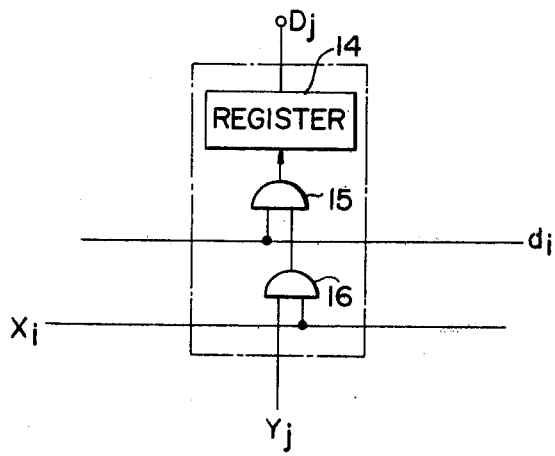

FIG. 4 illustrates an embodiment of the switch at each point of intersections of the signal lines of the switch matrixes 5 in FIG. 2 and 5-2 in FIG. 3. The switch is composed of AND gates 11 and 12 and a D-flip-flop 13. When the column and row control signals $X_i$ and $Y_j$ both become "1," inputs to CP and D terminals of the D-flip-flop 13 and the output from its Q terminal becomes "1." Consequently, the AND gate 11 is opened, through which the input line $d_i$ and the data bus $D_j$ are interconnected.

FIG. 5 shows a modified form of the switch depicted in FIG. 4. In this case, the switch is composed of AND gates 15 and 16 and a register 14. When the column and row control signals $X_i$ and $Y_j$ become "1," the output from the AND gate 16 becomes "1," so that the AND gate 15 is opened to set the data of the input/output line $d_i$ in the register 14 and the content of the register 14 is sent out to the data bus $D_j$.

Figure 6:
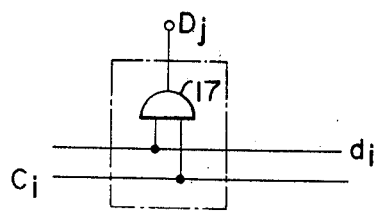
FIG. 6 illustrates one embodiment of a switch of a one-dimensional switch matrix shown in FIG. 3.

FIG. 6 illustrates an embodiment of the switch at each point of intersection of the signal lines of the switch matrix 5-1 in FIG. 3. The switch is formed with an AND gate 17. By the control information $C_i$ becoming "1," the input/output line $d_i$ and the data bus $D_j$ are connected to each other.

In each of the embodiments of this invention described in the foregoing, it is necessary that at least a predetermined number of minor blocks (more than nine blocks in the foregoing) be perfect and it is desired that major blocks where the number of perfect minor blocks is smaller than the predetermined number are omitted.

As has been described in detail in the foregoing, this invention enables the use of semiconductor memory elements having some imperfect memory cells, and hence dispenses with a close examination of the semiconductor memory elements during the production process. Consequently, this invention produces various effects such as lowering of the manufacturing cost of the memory element, curtailment of the cost of the examination, economization of the memory device, etc., and has the advantage that a large capacity memory device can be constructed at low cost.

Further, in the case of write or read data after removing a block having an imperfect memory cell, if the state of the except portion is established by the information read out from the control information registration portion 4 before the data is established, no time lag is introduced in operation by the provision of such additional circuits as the switch matrix and so forth, and real-time operation can be achieved.

Moreover, if the system capacity is 8MB, if the ratio of imperfection of memory cells is 50% and if one word is 9-bit, it is sufficient that hardware of the additional circuits such as the control information registration portion 4 and so on is 0.13% of the system capacity. Namely, by a little additional circuit elements, it is possible to actuate the memory device so that it appears to the user to perform its normal operation, even if imperfect memory cells are contained.

It will be apparent that many modifications and variations may be effected without departing from the scope of the novel concepts of this invention.

What is claimed is:

1. A memory device comprising:
   a memory portion composed of a plurality of major memory blocks, each composed of at least a predetermined number of minor memory blocks, the minor memory blocks being respectively composed of a plurality of memory cells for data storage and the major memory blocks being respectively given addresses corresponding thereto;
   a control information registration portion for registering and storing information as to whether or not each of the minor memory blocks making up each of the major memory blocks includes a defective memory cell;
   a block select portion for selecting one of the major memory blocks; and
   an input/output control portion connected to data bus lines for reading out the control information registered and stored in the control information registration portion corresponding to the major memory block selected by the block select portion to select a predetermined number of minor memory blocks having no defective memory cell from the group of minor memory blocks making up the selected major block and to interconnect those selected to the bus lines to cause them to perform data inputting and outputting.

2. A memory device according to claim 1, wherein the input/output control portion includes a column scanner operable with a column clock signal to produce a scanning signal; gate circuits for producting column control signals of the AND conditions between the scanning signal of the column scanner and the control information read out from the control information registration portion; a row scanner operable with a row clock signal of the AND condition between the OR logic output of the column control signals and the column clock signal to produce a scanning signal; gate circuits for producing row control signals of the AND conditions between the scanning signal of the row scanner and the OR logic output of the column control signals; and a switch matrix closing a switch at the point of intersection of signal lines supplied with the column and row control signals to connect an input/output line with a data bus, whereby a predetermined number of minor memory blocks having no defective memory cell are selected and caused to perform data inputting and outputting.

3. A memory device according to claim 1, wherein the input/output control portion includes a one-dimensional switch array for connecting one part of input/output lines with a data bus based on signals of one part of the control information read out from the control information registration portion; and a switch matrix closing a switch at each point of intersection of signal lines supplied with a column control signal of the AND condition between the remaining signals of the control information and the scanning signal of the column scanner and a row control signal of the AND condition between reversed signals of the signals of one part of the control information and the scanning signal of the row scanner, thereby connecting an input/output line with a data bus.

4. A memory device comprising:
(a) a plurality of minor memory blocks, each comprising at least a plurality of memory cells for data storage, each memory cell being selectable by the lower bit portion of a given address code, and capable of having data written into the selected memory cell for data read-out therefrom;
(b) a plurality of major memory blocks, each comprising an assembly of minor memory blocks equal in number to bits necessary for word organization of stored data, and a predetermined number of excess minor memory blocks in reserve;
(c) a memory plane portion, comprising a plurality of major memory blocks, block select lines each assigned to one of the major memory blocks, and data I/O lines from each minor memory block, the I/O lines of corresponding minor blocks in each major memory block being wired-OR'ed with each other;
(d) a block select portion composed of means supplied with the upper bit portion of a given address code to decode it for selecting one of the block select lines and applying thereby a signal actuating the minor memory blocks in the selected one of the major memory blocks;
(e) a control information registration portion comprising,
(1) a memory module composed of a plurality of non-defective memory cells;
(2) the memory module having words equal in number to the major memory blocks of the memory plane portion, and each word having bits equal in number to the minor memory blocks of each major memory block so that each word corresponds to the major memory block of the memory plane portion and each bit corresponds to each minor memory block of the major memory block;
(3) data being stored in the control information registration portion such that "1" or "0" is stored depending upon whether the minor memory block designated by the bit in the major memory block designated by the word are defective or not; and
(4) means supplied with the upper bit portion of the given address code to select a designated word for outputting in parallel all of bit information making up the word; and
(f) a data line connecting portion comprising, a data bus having lines equal in number to the bits necessary for word organization, and means supplied with the stored data in the control information portion to select the same number of data I/O lines as the bits necessary for word organization for the connection thereof with the data bus, said data I/O lines only being from non-defective minor memory blocks.

5. A memory device according to claim 4, wherein the data line connecting portion is composed of a switching matrix which has rows equal in number to the minor memory blocks of each major memory block and which has columns equal in number to the bits for word organization.

6. A memory device according to claim 4, wherein the data line connecting portion is composed of a one-dimensional switching array having switches equal in number to the bit for word organization and a two-dimensional switching array having rows and columns equal in number to the excess minor memory blocks of each major memory block.

* * * * *